(12) United States Patent
Hong et al.

(10) Patent No.: US 10,580,961 B2
(45) Date of Patent: Mar. 3, 2020

(54) METHOD FOR DETERMINING A THRESHOLD VOLTAGE FOR OBTAINING A BATCH OF SENSING CHIPS WITH INCREASED SENSITIVITY AND METHOD FOR INCREASING SENSITIVITY OF THE BATCH OF SENSING CHIPS

(71) Applicant: National Tsing Hua University, Hsinchu (TW)

(72) Inventors: Chien-Chong Hong, Zhubei (TW); Guan-Lin Chen, Taichung (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 15/806,861

(22) Filed: Nov. 8, 2017

(65) Prior Publication Data

US 2018/0331278 A1  Nov. 15, 2018

(30) Foreign Application Priority Data

May 11, 2017 (TW) .............................. 106115610 A

(51) Int. Cl.
*H01L 41/25* (2013.01)
*H01L 41/253* (2013.01)
*H01L 41/047* (2006.01)
*H01L 21/66* (2006.01)
*H01L 41/193* (2006.01)
*H01L 41/113* (2006.01)
*H01L 41/083* (2006.01)

(52) U.S. Cl.
CPC ............ *H01L 41/253* (2013.01); *H01L 22/20* (2013.01); *H01L 41/047* (2013.01); *H01L 41/0471* (2013.01); *H01L 41/083* (2013.01); *H01L 41/1132* (2013.01); *H01L 41/193* (2013.01); *H01L 22/14* (2013.01)

(58) Field of Classification Search
CPC .............. G05B 13/028; G05B 19/4183; G05B 19/4184; G05B 19/41845; G05B 19/4185
See application file for complete search history.

(56) References Cited

U.S. PATENT DOCUMENTS 8,632,717 B2   1/2014  Hong et al.
2016/0172577 A1  6/2016  Hong et al.

OTHER PUBLICATIONS

Kuan-Wen Chen, et al., "Electrodeposition of Piezoelectric Polymer Ultrasonic Transceivers for On-Chip Antibiotic Biosensors," Journal of the Electrochemical Society, 163 (6), pp. B200-B205, (2016).

*Primary Examiner* — Tony Tran
(74) *Attorney, Agent, or Firm* — Fish & Richardson P.C.

(57) ABSTRACT

A method for determining a threshold voltage for a batch of sensing chips includes steps of: a) selecting at least three of micro-machined transceivers; b) conducting for each of the at least three of the micro-machined transceivers the following sub-steps of: b1) introducing a blank liquid into a micro-channel via an inlet port, b2) applying an alternate voltage to a micro-machined transmitter for a period of time, and b3) measuring an amplitude of an electric signal from a micro-machined receiver to obtain a maximum value and a minimum value; c) measuring a mid-value; and d) determining the threshold voltage. Also disclosed is a method for increasing sensitivity of the batch of sensing chips based on the threshold voltage.

11 Claims, 9 Drawing Sheets

METHOD FOR DETERMINING A THRESHOLD VOLTAGE FOR OBTAINING A BATCH OF SENSING CHIPS WITH INCREASED SENSITIVITY AND METHOD FOR INCREASING SENSITIVITY OF THE BATCH OF SENSING CHIPS

CROSS-REFERENCE TO RELATED APPLICATION

This application claims priority of Taiwanese Application No. 106115610, filed on May 11, 2017.

FIELD

The disclosure relates to a method for determining a threshold voltage for obtaining a batch of sensing chips with increased sensitivity, and more particularly to a method for determining a threshold voltage for obtaining a batch of sensing chips with increased sensitivity, each of which includes at least one micro-machined transceiver. The disclosure also relates to a method for increasing sensitivity of the batch of sensing chips.

BACKGROUND

A micro-machined piezoelectric transducer is a device that achieves conversion from mechanical to electrical energy or vice versa via a piezoelectric effect of a piezoelectric material, and can be simultaneously used as a transmitter and a receiver and therefore has a huge potential for development.

US 20160172577, which is a co-pending application of the applicant of the disclosure, discloses a method for fabricating a piezoelectric transducer. The piezoelectric transducer thus fabricated includes a substrate, a pair of patterned electrodes formed on the substrate, and a piezoelectric membrane formed on a positive electrode of the pair of patterned electrodes via a process which integrates a patterning process with a polarization process. A pair of the piezoelectric transducers may be used as a micro-machined transceiver of a biosensor for detection of an amount of an analyte such as ractopamine, benzylpenicillin, doxycycline, and the like. The sensing mechanism is based on a piezoelectric response change due to absorption of the analyte on the piezoelectric membrane.

However, since the piezoelectric membrane is formed on one of the positive and negative electrodes via in-situ deposition of a piezoelectric material, such as a piezoelectric polymer, impurities which may be contained in a piezoelectric suspension for forming the piezoelectric membrane will attach to the piezoelectric membrane thus formed, leading to inaccurate detection.

SUMMARY

An object of the disclosure is to provide a method for determining a threshold voltage for obtaining a batch of sensing chips with increased sensitivity, each of which includes at least one micro-machined transceiver.

Another object of the disclosure is to provide a method for increasing sensitivity of the batch of sensing chips.

According to a first aspect of the disclosure, there is provided a method for determining a threshold voltage for obtaining a batch of sensing chips with increased sensitivity. Each of the sensing chips includes an upper carrier plate, a lower carrier plate, a spacer film, and at least one micro-machined transceiver. The upper carrier plate has at least one inlet port. The lower carrier plate has at least one outlet port and is spaced apart from the first carrier plate to define an accommodation zone disposed downstream of the at least one inlet port. The spacer film has at least one micro-channel and is disposed in the accommodation zone so as to permit the at least one micro-channel to be in fluid communication with the at least one inlet port and the at least one outlet port. Each micro-machined transceiver includes a micro-machined transmitter and a micro-machined receiver. The micro-machined transmitter includes an electrode set formed on a lower surface of the upper carrier plate and having a positive patterned electrode and a negative patterned electrode, and a first patterned piezoelectric layer formed on one of the positive and negative patterned electrodes by drop-on-demand deposition. The micro-machined receiver includes an electrode set formed on an upper surface of the lower carrier plate and having a positive patterned electrode and a negative patterned electrode, and a second patterned piezoelectric layer formed on one of the positive and negative patterned electrodes of the micro-machined receiver by drop-on-demand deposition.

The method according to the first aspect of the disclosure includes the steps of:

a) selecting at least three of the micro-machined transceivers;

b) conducting for each of the at least three of the micro-machined transceivers the following sub-steps of:

b1) introducing a blank liquid into the micro-channel via the inlet port, b2) applying an alternate voltage (V1) not larger than 40 V to the micro-machined transmitter for a period of time, and b3) measuring an amplitude (V2) of an electric signal from the micro-machined receiver to obtain a maximum value $V_{max}$ and a minimum value $V_{min}$;

c) measuring a mid-value $V_{mid}$ according Formula (A)

$$V_{mid} = (V_{max} + V_{min})/2 \qquad\qquad \text{(A); and}$$

d) determining the threshold voltage $V_{threshold}$ to be the $V_{mid}$ when a precision ratio calculated according to Formula (B) is not larger than 50%

$$\text{precision ratio} = ((V_{max} - V_{mid})/V_{mid}) \times 100\% \qquad\qquad \text{(B).}$$

According to a second aspect of the disclosure, there is provided a method for increasing sensitivity of a batch of sensing chips each of which includes at least one micro-machined transceiver. The method according to the second aspect of the disclosure includes steps of:

A) determining a threshold voltage for the batch of sensing chips by the method according to the first aspect of the disclosure; and B) conducting for each of the remaining micro-machined transceivers of the batch of the sensing chips the following sub-steps of:

B1) introducing the blank liquid into the micro-channel via the inlet port;

B2) applying the alternate voltage (V1) not larger than 40 V to the micro-machined transmitter for the period of time, B3) measuring the amplitude (V2) of the electric signal from the micro-machined receiver, and B4) ceasing sub-steps B1)-B3) if a deviation ratio calculated from Formula (C) is not larger than 25%

$$\text{deviation ratio} = (|V2 - V_{threshold}|/V_{threshold}) \times 100\% \qquad (C).$$

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
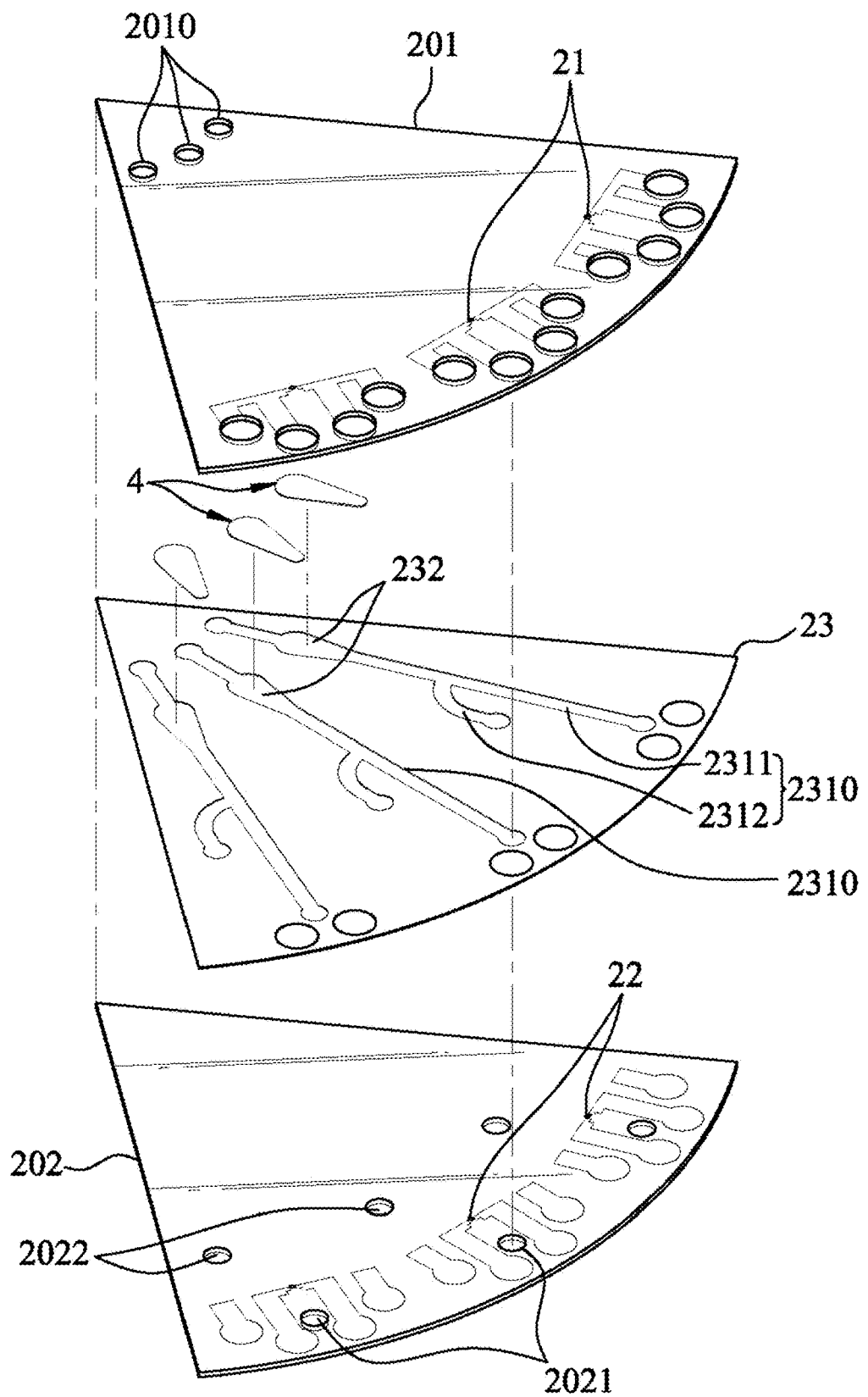
FIG. 1 is an exploded perspective view of a sensing chip which includes an array of micro-machined transceivers.

Before the present invention is described in greater detail with reference to the accompanying embodiments, it should be noted herein that like elements are denoted by the same reference numerals throughout the disclosure.

An embodiment of a method for increasing sensitivity of a batch of sensing chips according to the disclosure is used to treat micro-machined transceivers mounted on each of the batch of sensing chips before the sensing chips are used for detection of an analyte. In the embodiment, a threshold voltage for the batch of sensing chips should be determined first.

Figure 2:
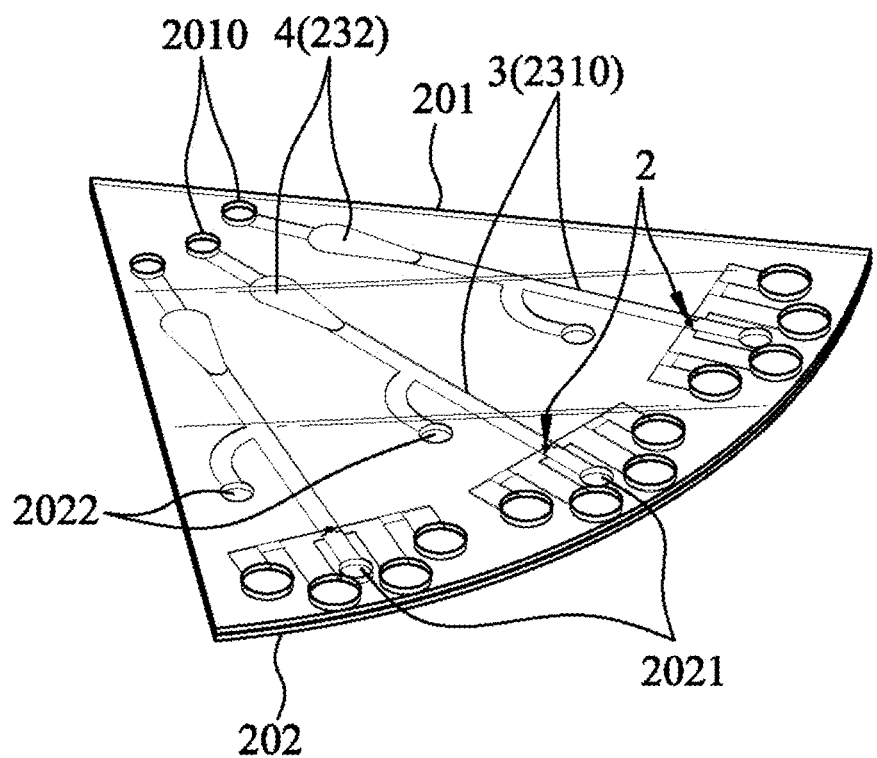
FIG. 2 is a perspective view of the sensing chip.

Referring to FIGS. 1, 2, 3, and 4, each of the sensing chips is shown to include an upper carrier plate 201, a lower carrier plate 202, a spacer film 23, and a plurality of micro-machined transceivers 2. The upper carrier plate 201 has a plurality of inlet ports 2010. The lower carrier plate 202 has a plurality of first outlet ports 2021 and a plurality of second outlet ports 2022, and is spaced apart from the first carrier plate 201 to define an accommodation zone disposed downstream of the inlet ports 2010. The spacer film 23 has a plurality of micro-channels 2310 and is disposed in the accommodation zone so as to permit each of the micro-channels 2310 to be in fluid communication with a corresponding one of the inlet ports 2010 and corresponding ones of the first and second outlet ports 2021, 2022. Each of the micro-channels 2310 includes a main micro-channel portion 2311 and a side micro-channel portion 2312. Three of the micro-machined transceivers 2 are illustrated in FIGS. 1 and 2. Each of the micro-machined transceivers 2 includes a micro-machined transmitter 21 and a micro-machined receiver 22. The micro-machined transmitter 21 includes an electrode set formed on a lower surface of the upper carrier plate 201 and having a positive patterned electrode 211 and a negative patterned electrode 212, and a first patterned piezoelectric layer 213 formed on the positive patterned electrode 211 by drop-on-demand deposition. The micro-machined receiver 22 includes an electrode set formed on an upper surface of the lower carrier plate 202 and having a positive patterned electrode 221 and a negative patterned electrode 222, and a second patterned piezoelectric layer 223 formed on the positive patterned electrode 221 of the micro-machined receiver 22 by drop-on-demand deposition.

An embodiment of a method for determining a threshold voltage for obtaining a batch of sensing chips with increased sensitivity according to the disclosure includes steps of:

a) selecting at least three of the micro-machined transceivers 2 that may be disposed on the same or different sensing chips;

b) conducting for each of the at least three of the micro-machined transceivers 2 the following sub-steps of:

b1) introducing a blank liquid 3 into a corresponding of the micro-channels 2310 via a corresponding one of the inlet ports 2010, b2) applying an alternate voltage (V1) not larger than 40 V to the micro-machined transmitter 21 for a period of time, and b3) measuring an amplitude (V2) of an electric signal from the micro-machined receiver 22 to obtain a maximum value $V_{max}$ and a minimum value $V_{min}$;

c) measuring a mid-value $V_{mid}$ according to Formula (A)

$$V_{mid} = (V_{max} + V_{min})/2 \qquad (A); \text{ and}$$

d) determining the threshold voltage $V_{threshold}$ to be the $V_{mid}$ when a precision ratio calculated according to Formula (B) is not larger than 50%

$$\text{precision ratio} = ((V_{max} - V_{min})/V_{mid}) \times 100\% \qquad (B).$$

The blank liquid 3 used in the embodiment is deionized water.

Figure 3:
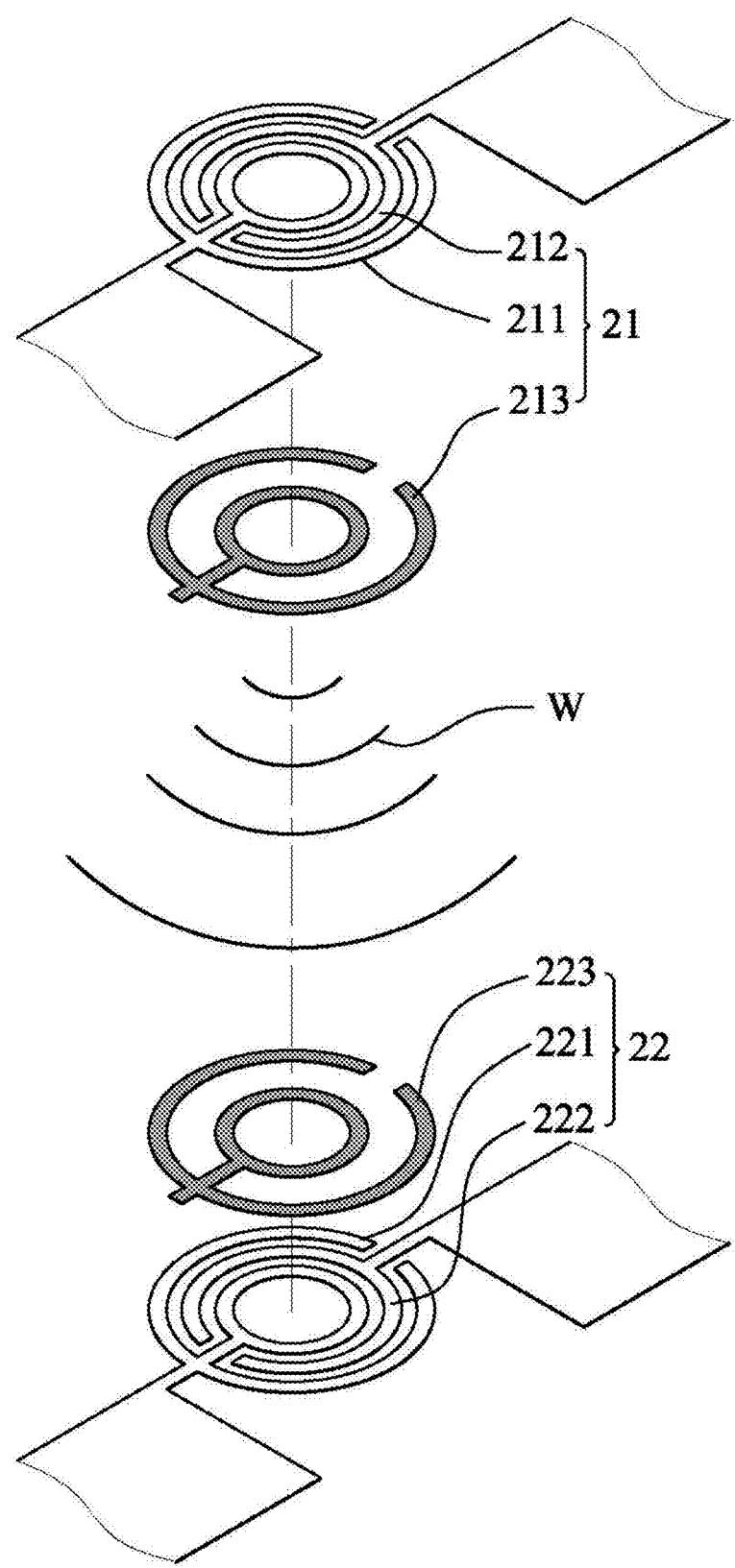
FIG. 3 is an exploded schematic perspective view to illustrate a working mechanism of a micro-machined transceiver.
Figure 4:
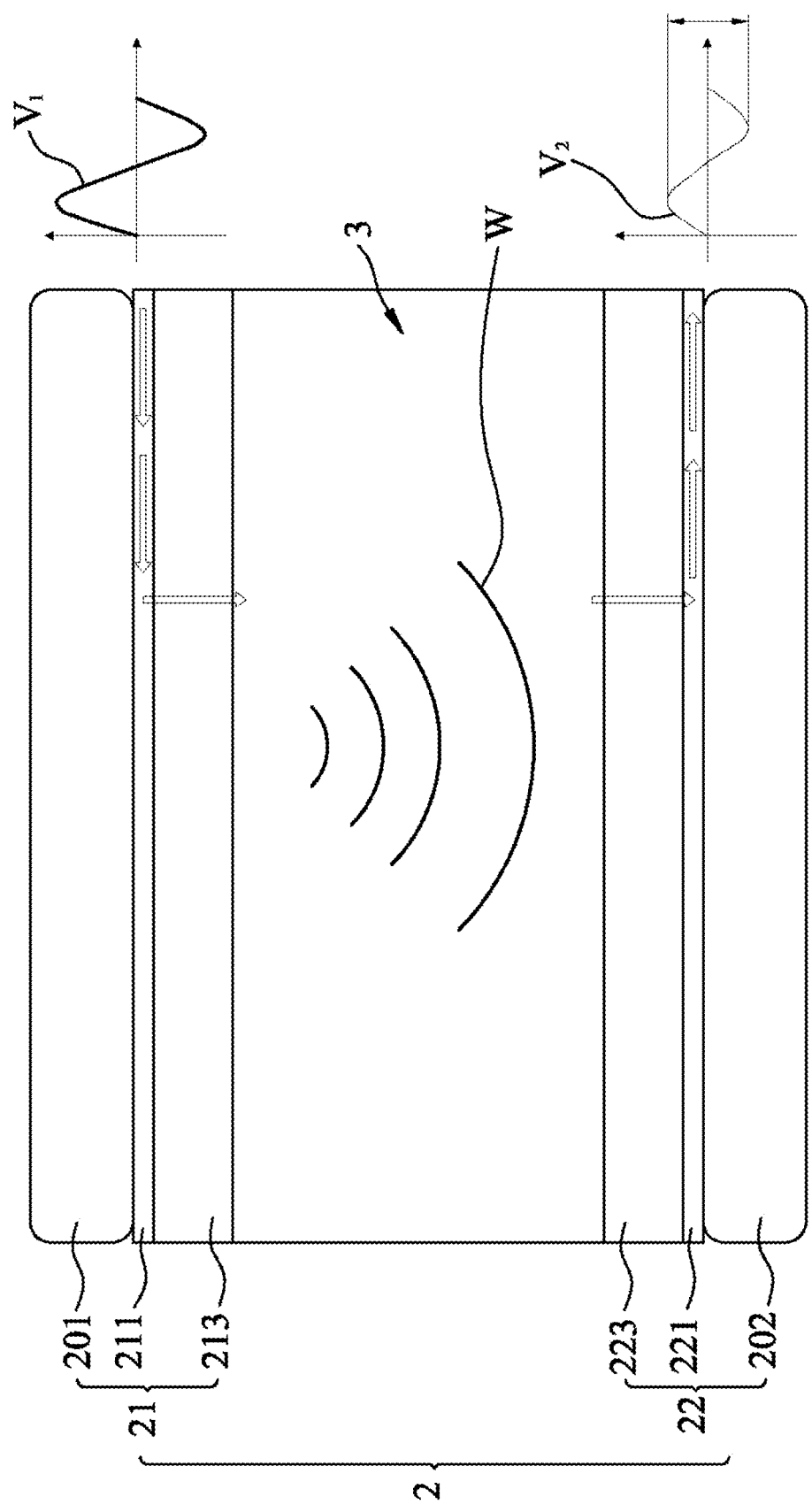
FIG. 4 is a schematic side view to illustrate the working mechanism of the micro-machined transceiver.

Specifically referring to FIGS. 3 and 4, after the alternate voltage (V1) is applied to each of the micro-machined transmitters 21, the alternate voltage (V1) is transformed into an acoustic wave (W) via a converse piezoelectric effect of the first patterned piezoelectric layer 213 on the positive patterned electrode 211 of the micro-machined transmitter 21. The acoustic wave (W) is then transmitted to the second patterned piezoelectric layer 223 on the positive patterned electrode 221 of the micro-machined receiver 22 through the blank liquid 3 and is transformed into the amplitude (V2) of the electric signal via a piezoelectric effect of the second patterned piezoelectric layer 223.

In certain embodiments, the alternate voltage (V1) is in a range from 0.4 V to 40.0 V and has a frequency ranging from 1 kHz to 10 MHz. In the illustrated examples, the alternate voltage (V1) is 4 V and has a frequency of 10 kHz, and the precision ratio is 0.6%.

The alternate voltage (V1) is in a waveform selected from the group consisting of a sine waveform, a square waveform, and a triangle waveform. In the illustrated examples, the alternate voltage (V1) is in a sine waveform.

The period of time in sub-step b2) is in a range from 0.1 s to 30 s.

Each of the micro-machined transmitters 21 and the micro-machined receivers 22 is a piezoelectric micro-machined transducer, which may be fabricated by the method disclosed in the aforesaid US 20160172577. Details of the method may be found in the specification of the document.

Figure 5:
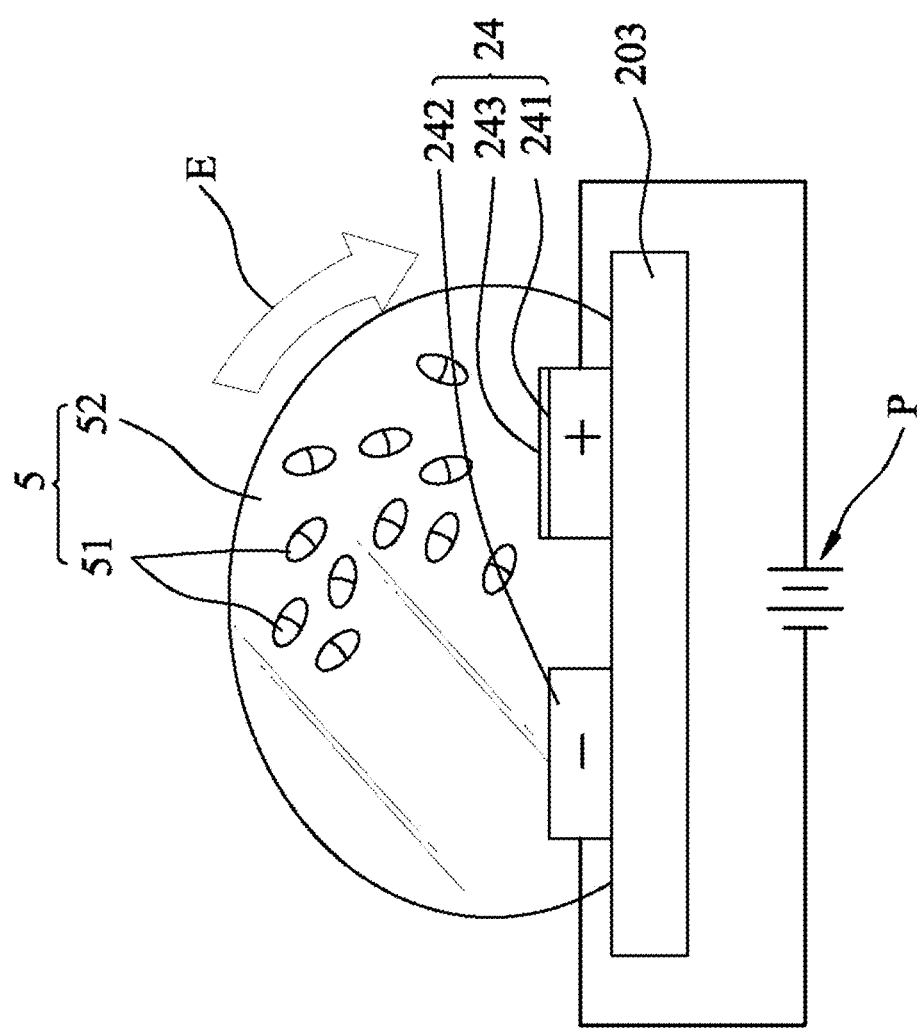
FIG. 5 is a schematic side view to illustrate the formation of a patterned piezoelectric layer on a positive patterned electrode of a micro-machined transducer used as a micro-machined transmitter and/or a micro-machined receiver of the sensing chip.

Referring to FIG. 5, a direct current (DC) voltage from a power supply (P) is applied between a positive patterned electrode 241 and a negative patterned electrode 242 to form an electric field (E). Under the influence of the electric field (E), a plurality of piezoelectric particles 51 within a droplet of a piezoelectric suspension 5 containing a dispersant 52 for dispersing the piezoelectric particles 51 move towards and are deposited on the positive patterned electrode 241 to form a patterned piezoelectric layer 243. The above mechanism for forming the patterned piezoelectric layer 243 is based on electrophoretic deposition (EPD). The dispersant 52 is an organic solvent. A non-limiting example of the organic solvent is dimethyl sulfoxide. The positive patterned electrode 241 and the negative patterned electrode 242 are made from gold.

The first and second patterned piezoelectric layers 213, 223 are formed from a piezoelectric polymer. In other words, the piezoelectric particles 51 for forming the patterned piezoelectric layer 243 are made from the piezoelectric polymer. The piezoelectric polymer is selected from a group consisting of polyvinylidene difluoride (PVDE), polyvinylidene difluoride-co-trifluoroethylene (P(VDE-TrFE)), and a combination thereof. Each of the first and second patterned piezoelectric layers 213, 223 has a thickness of about 4 μm.

Each of the top and lower carrier plates 201, 202 is made from a 4-inch cyclic olefin copolymer (COC) wafer. The spacer film 23 is made from a double-sided tape having a thickness of 60 μm. The double-sided tape is patterned using a CNC (computer-numerical-control) machined knife mold to form a plurality of the micro-channels 2310 and a plurality of chambers 232, as specifically shown in FIG. 1.

A ratio of a surface area of the first patterned piezoelectric layer 213 to a total surface area of the positive and negative patterned electrodes 211, 212 of the micro-machined transmitter 21 ranges from 0.40 to 0.85. Similarly, a ratio of a surface area of the second patterned piezoelectric layer 223 to a total surface area of the positive and negative patterned electrodes 221, 222 of the micro-machined receiver 22 ranges from 0.40 to 0.85.

Figure 6:
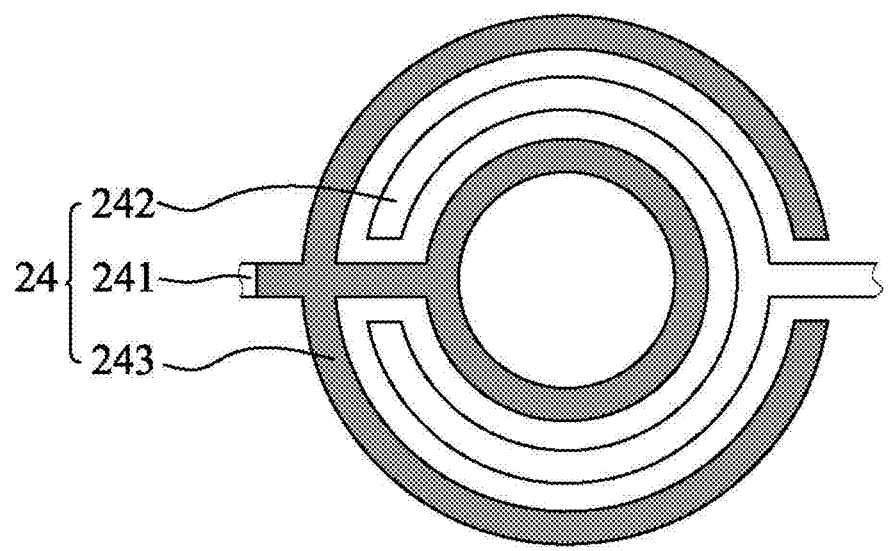
FIG. 6 is a schematic planar view of a first configuration of the micro-machined transducer.

Referring to FIG. 6, a first configuration of the micro-machined transducer 24, which may be used as the micro-machined transmitter 21 and/or the micro-machined receiver 22 of each of the sensing chips, is illustrated, in which the positive and negative patterned electrodes 241, 242 are arranged in a concentric manner. An outermost diameter of the positive patterned electrode 241 is 680 μm, the width of each of the positive and negative patterned electrodes 241, 242 is 40 μm, the spacing distance between the positive patterned electrode 241 and the negative patterned electrode 242 is 40 μm, and a ratio of a surface area of the patterned piezoelectric layer 243 to a total surface area of the positive and negative patterned electrodes 241, 242 of the micro-machined transducer 24 is 0.387.

Figure 7:
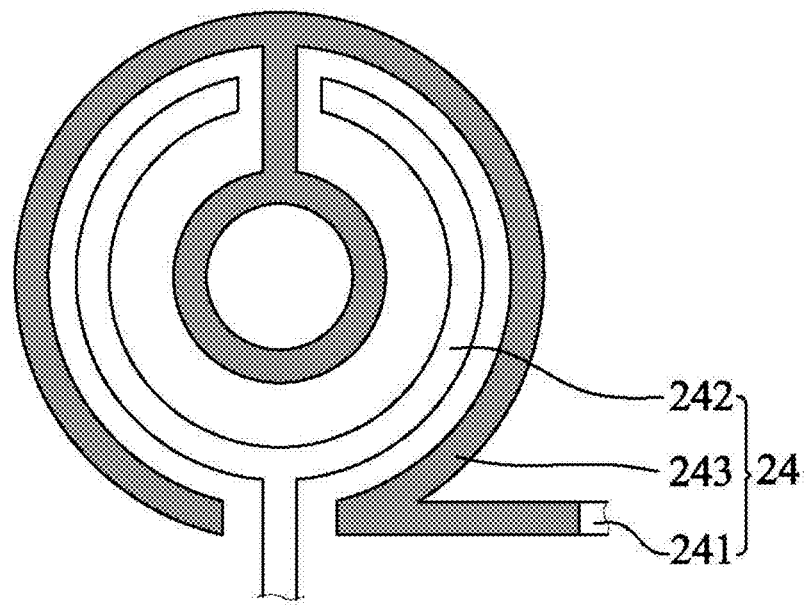
FIG. 7 is a schematic planar view of a second configuration of the micro-machined transducer.

With reference to FIG. 7, a second configuration of the micro-machined transducer 24 is illustrated and is similar to the first configuration of the micro-machined transducer 24 except that the width of each of the positive and negative patterned electrodes 241, 242 is 50 μm, the spacing distance between the positive patterned electrode 241 and the negative patterned electrode 242 is 50 μm, and the ratio of the surface area of the patterned piezoelectric layer 243 to the total surface area of the positive and negative patterned electrodes 241, 242 of the micro-machined transducer 24 is 0.4211.

Figure 8:
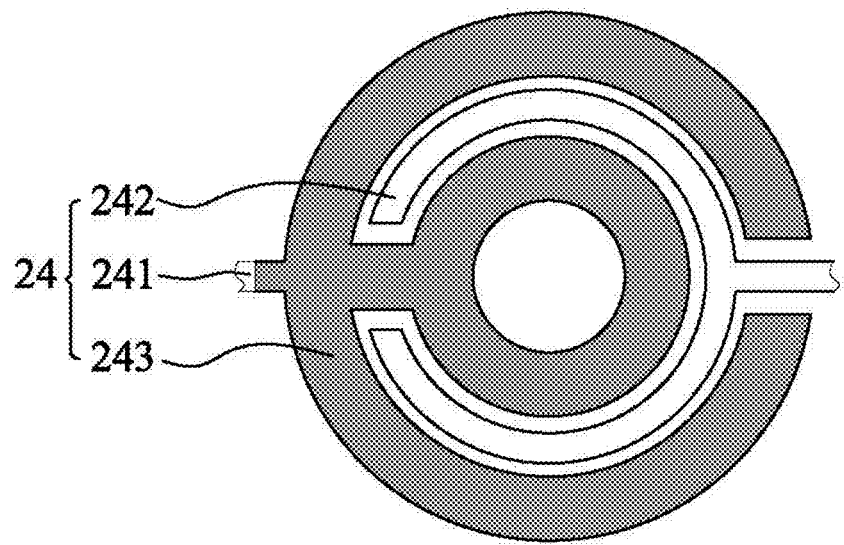
FIG. 8 is a schematic planar view of a third configuration of the micro-machined transducer.

With reference to FIG. 8, a third configuration of the micro-machined transducer 24 is illustrated and is similar to the first configuration of the micro-machined transducer 24 except that the width of each of the positive and negative patterned electrodes 241, 242 is 80 μm, the spacing distance between the positive patterned electrode 241 and the negative patterned electrode 242 is 20 μm, and the ratio of the surface area of the patterned piezoelectric layer 243 to the total surface area of the positive and negative patterned electrodes 241, 242 of the micro-machined transducer 24 is 0.6561.

Figure 9:
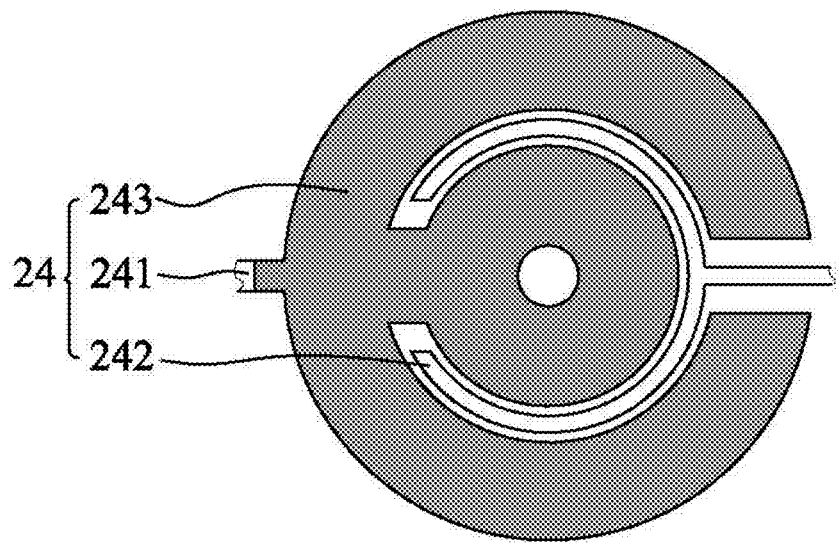
FIG. 9 is a schematic planar view of a fourth configuration of the micro-machined transducer.

With reference to FIG. 9, a fourth configuration of the micro-machined transducer 24 is illustrated and is similar to the third configuration of the micro-machined transducer 24 except that the width of the positive patterned electrode 241 is 120 μm, and the ratio of the surface area of the patterned piezoelectric layer 243 to the total surface area of the positive and negative patterned electrodes 241, 242 of the micro-machined transducer 24 is 0.8264.

It should be noted that the larger the aforesaid ratio, the better the signal response. Since the ratio of the surface area of the patterned piezoelectric layer 243 to the total surface area of the positive and negative patterned electrodes 241, 242 of the fourth configuration of the micro-machined transducer 24 is relatively large, the micro-machined transducer 24 with the fourth configuration is used as the micro-machined transmitter 21 and the micro-machined receiver 22 of the sensing chip in Examples 1 and 2 and Comparative Example 1.

When a micro-machined transducer in which the aforesaid ratio is relatively small is used as a micro-machined transmitter and/or a micro-machined receiver of a sensing chip, the signal response thereof may be enhanced by increasing an alternate voltage to the micro-machined transmitter or a frequency of the alternate voltage.

Referring further to FIGS. 1, 2, 3, and 4, an embodiment of a method for increasing sensitivity of a batch of sensing chips according to the disclosure includes steps of:

A) determining a threshold voltage for the batch of sensing chips by the aforesaid embodiment of a method for determining a threshold voltage for obtaining a batch of sensing chips according to the disclosure;

B) conducting for each of the remaining micro-machined transceivers 2 of the batch of the sensing chips the following sub-steps of:

B1) introducing the blank liquid 3 into a corresponding one of the micro-channels 2310 via a corresponding one of the inlet ports 2010;

B2) applying the alternate voltage (V1) not larger than 40 V to the micro-machined transmitter 21 for the period of time, B3) measuring the amplitude (V2) of the electric signal from the micro-machined receiver 22, and B4) ceasing sub-steps B1)-B3) if a deviation ratio calculated from Formula (C) is not larger than 25%

$$\text{deviation ratio} = (|V2 - V_{threshold}|/V_{threshold}) \times 100\% \quad \text{(C); and}$$

C) discharging the blank liquid 3 out of the micro-channels 2310.

In the illustrated examples, the alternate voltage (V1) is 4 V and has a frequency of 10 kHz, and the deviation ratio is 0.3%.

After each of the micro-machined transceivers 2 mounted on each of the batch of the sensing chips is treated by the embodiment of the method for increasing sensitivity of the batch of sensing chips according to the disclosure, the sensitivity of the batch of sensing chips is increased and the sensing chips may be used for detecting the analyte with enhanced accuracy. The analyte which may be detected by the sensing chips includes various drugs such as ractopamine, benzylpenicillin, doxycycline, and the like that may be contained in foods such as meats and the like.

Referring again to FIGS. 1 and 2, each of the sensing chips is shown to further include a plurality of molecularly imprinted films 4 which are disposed between one of the upper and lower carrier plates 201, 202 and the spacer film 23, and each of which is disposed above a corresponding one of the chambers 232. Each of the molecularly imprinted films 4 has a specific absorption to the analyte to be detected and has a size of 25 mm$^2$ and a thickness of 30 μm. The molecularly imprinted film 4 has specific absorptions of 206%, 340%, and 206% for ractopamine, benzylpenicillin, and doxycyclone, respectively.

In a process for detecting the analyte using the sensing chips in which the micro-machined transceivers 2 are treated by the aforesaid method of the disclosure, a fluid containing the analyte is introduced into one or more of the chambers 232 via corresponding one or more of the inlet ports 2010 and is allowed to stay in the one or more of the chambers 232 for 1 minute so as to permit the analyte to be absorbed by corresponding one or more of the molecularly imprinted films 4. Deionized water is then introduced via the one or more of the inlet ports 2010. The deionized water flows through the one or more of the chambers 232 and corresponding one or more of the side micro-channel portions 2312, and is discharged from corresponding one or more of the second outlet ports 2022 so as to clean the one or more of the chambers 232. An aqueous solution of sodium dodecyl sulfate is then introduced into the one or more of the chambers 232 via the corresponding one or more of the inlet ports 2010 and is allowed to stay in the one of more of the chambers 232 for 1 minute so as to extract the analyte from the corresponding one or more the molecularly imprinted films 4 into the aqueous solution of sodium dodecyl sulfate. The aqueous solution of sodium dodecyl sulfate containing the analyte then flows through corresponding one or more of the main micro-channel portions 2311 to corresponding one or more of the micro-machined transceivers 2 for detection prior to being discharged from corresponding one or more of the first outlet ports 2021.

It should be noted that the numbers of the inlet ports 2010, the micro-channels 2310, the first outlet ports 2011, and the second outlet ports 2022 are not limited to those illustrated in FIGS. 1 and 2, and may be varied according to specific requirements.

Examples of the disclosure will be described hereinafter. It is to be understood that these examples are exemplary and explanatory and should not be construed as a limitation to the disclosure.

Example 1

A sensing chip having nine micro-machined transceivers was used. Deionized water was introduced into main micro-channel portions of micro-channels via inlet ports and was allowed to flow to micro-machined transceivers. A PXIe-5122 high resolution oscilloscope (National Instruments, U.S.A.) and a PXI-5404 signal generator (National Instruments, U.S.A.) cooperating with a LAbVIEW program were used to control operation of the sensing chip and acquire data from the sensing chip automatically.

After a 4V alternate voltage in a sine waveform and having a frequency of 10 kHz was applied to a micro-machined transmitter of each of the micro-machined transceivers, the alternate voltage was transformed into an acoustic wave via a converse piezoelectric effect of a patterned piezoelectric layer on a positive patterned electrode of the micro-machined transmitter. The acoustic wave was then transmitted to a patterned piezoelectric layer on a positive patterned electrode of a micro-machined receiver of each of the micro-machined transceivers through deionized water and was transformed into an amplitude of an electric signal via a piezoelectric effect of the patterned piezoelectric layer on the positive patterned electrode of the micro-machined receiver.

The alternate voltages were applied to the micro-machined transmitter of each of the micro-machined transceivers periodically and the amplitudes of the electric signals from the micro-machined receiver of each of the micro-machined transceivers were acquired accordingly until a deviation ratio of the amplitude of the electric signal from the micro-machined receiver of each of the micro-machined transceivers varied from a threshold voltage (which was determined previously to be 1.640 V) is not larger than 0.3.

Figure 10:
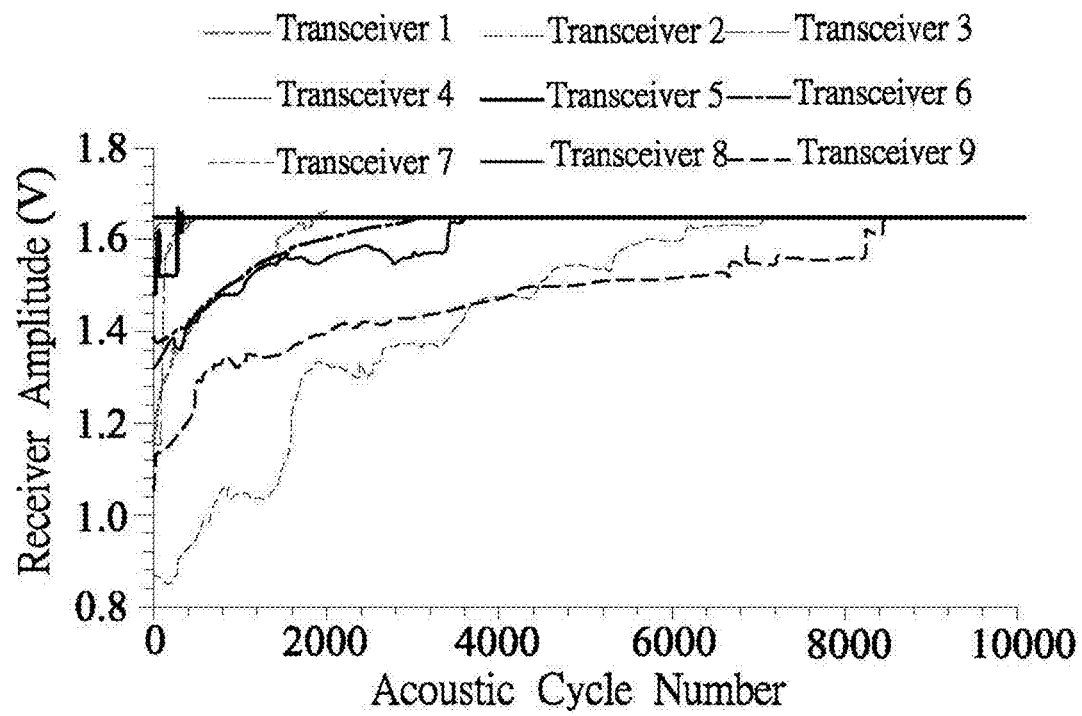
FIG. 10 illustrates plots of receiver amplitude versus acoustic cycle for nine micro-machined transceivers in Example 1 treated by the embodiment of the method for increasing sensitivity of a sensing chip according to the disclosure.

With reference to FIG. 10, in each of the nine micro-machined transceivers of the sensing chip, the amplitude of the electric signal from the micro-machined receiver was enhanced with the increase of the acoustic cycle number and reached a steady value of about 1.640 V, demonstrating that the amplitude of the electric signal from the micro-machined receiver of each of the micro-machined transceivers of the sensing chip may be enhanced by the method of the second aspect of the disclosure.

Figure 11:
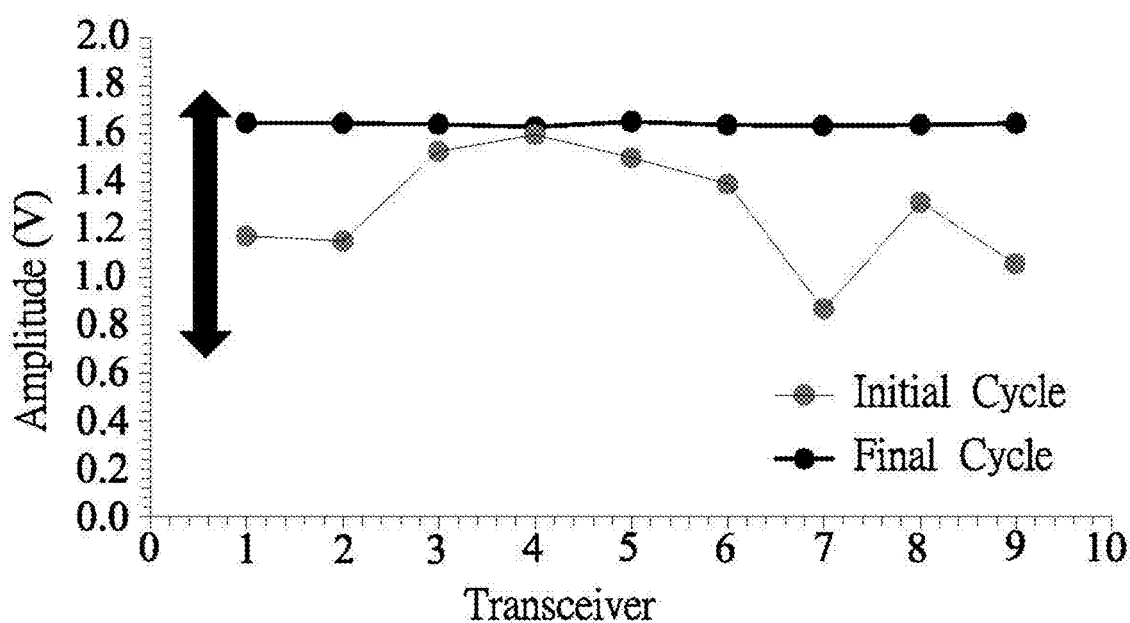
FIG. 11 illustrates comparisons between the initial receiver amplitudes and the receiver amplitudes achieved after the treatment by the embodiment of the method for increasing sensitivity of a batch of sensing chips according to disclosure for the nine micro-machined transceiver in Example 1.

Reference is made to FIG. 11. As shown, a variation coefficient among the amplitudes of the electric signals from the nine micro-machined receivers for an initial cycle was 17.79%. In contrast thereto, the variation coefficient among the amplitudes of the electric signals from the nine micro-machined receivers for the last one of the subsequent cycles run by the method of the disclosure was significantly reduced to 0.38%, demonstrating that the sensitivity of the micro-machined transceivers of the sensing chip may be enhanced as a result of a significant reduction in the variation coefficient among the amplitudes of the electric signals from the micro-machined receivers.

Without being bound by any theory, it is believed that impurities attached to the patterned piezoelectric layer of the micro-machined transducer used as the micro-machined transmitter and the micro-machined receiver of the micro-machined transceiver of the sensing chip are removed and the piezoelectric polymers in the patterned piezoelectric layer of the micro-machined transducer are densified by the method of the second aspect of the disclosure such that the sensitivity of the micro-machined transceiver of the sensing chip may be enhanced.

Example 2

Figure 13:
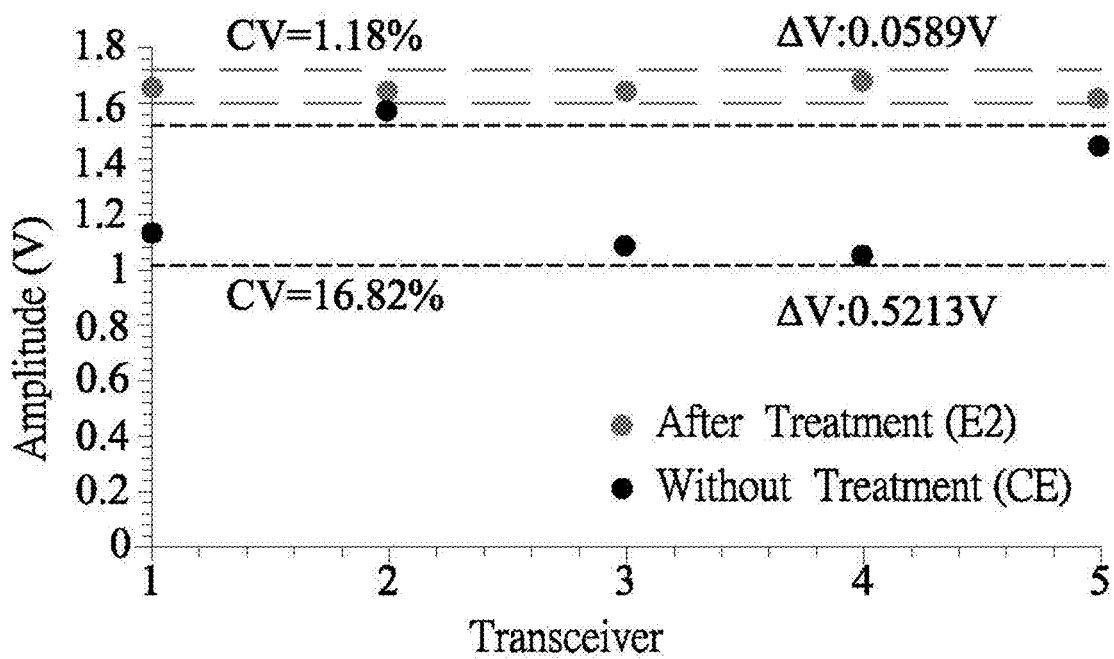
FIG. 13 illustrates comparisons between the receiver amplitudes of the five micro-machined transceiver in Example 2 treated by the embodiment of the method for increasing sensitivity of a batch of sensing chips according to the disclosure and those of five micro-machined transceivers in Comparative Example 1 untreated by the embodiment of the method for increasing sensitivity of a batch of sensing chips according to the disclosure in response to a ractopamine solution at a concentration of 20 ppb.

A sensing chip having five micro-machined transceivers was used and was treated by the same method as that in Example 1. A fluid containing 20 ppb of ractopamine was introduced into five chambers of the sensing chip via five corresponding inlet ports and was allowed to stay in the chambers for 1 minute to permit ractopamine to be absorbed by five corresponding molecularly imprinted films. Deionized water was then introduced via the inlet ports, was allowed to flow through the chambers and five corresponding side micro-channel portions, and was discharged from five corresponding second outlet ports to clean the chambers. An aqueous solution of sodium dodecyl sulfate was then introduced into the chambers via the inlet ports and was allowed to stay in the chambers for 1 minute to extract ractopamine from the molecularly imprinted films into the aqueous solution of sodium dodecyl sulfate, which then flowed through five corresponding main micro-channel portions to five corresponding micro-machined transceivers for detection. A 4V alternate voltage in a sine waveform and having a frequency of 10 kHz was applied to a micro-machined transmitter of each of the micro-machined transceivers, and an amplitude of an electric signal from the micro-machined receiver of each of the micro-machined transceivers was measured. The results are shown in FIG. 13.

Comparative Example 1

The sensing chip having five micro-machined transceivers used in Example 2 was used for the detection of the fluid containing 20 ppb of ractopamine except that the micro-machined transceivers were not treated by the method of the second aspect of the disclosure.

Figure 12:
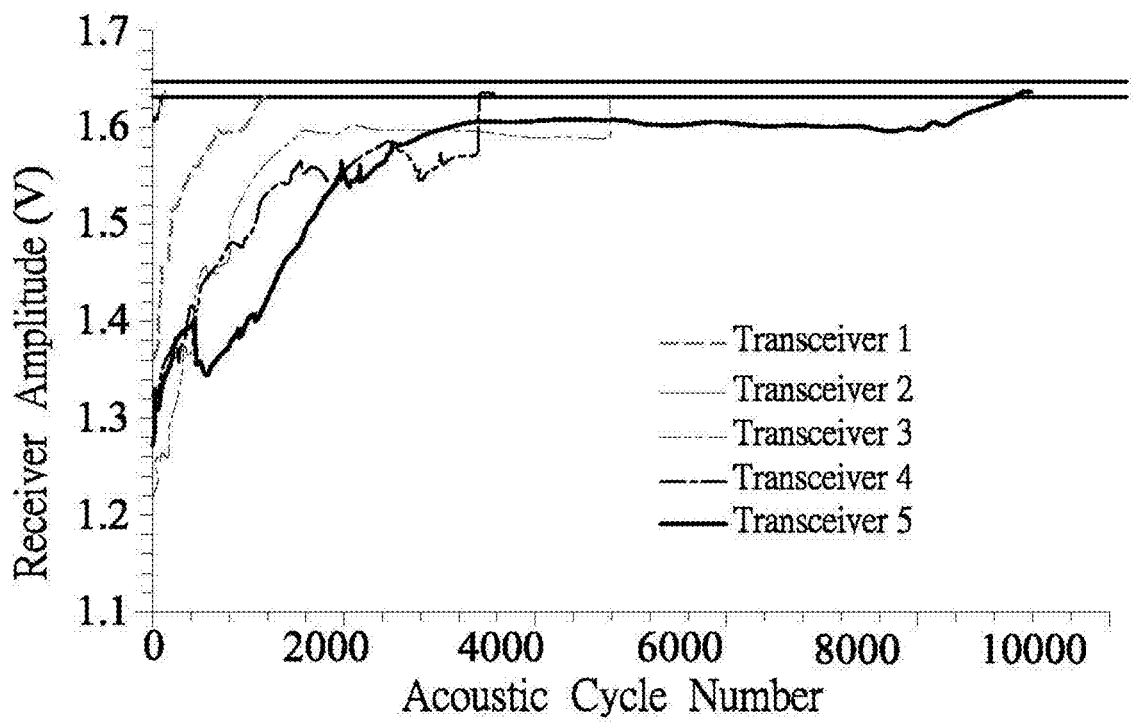
FIG. 12 illustrates plots of receiver amplitude versus acoustic cycle for five micro-machined transceivers in Example 2 treated by the embodiment of the method for increasing sensitivity of a sensing chip according to the disclosure.

With reference to FIG. 12, similarly, in each of the five micro-machined transceivers of the sensing chip used in Example 2, the amplitude of the electric signal from the micro-machined receiver was enhanced with the increase of the acoustic cycle number and reached a steady value of about 1.640 V, demonstrating that the amplitude of the electric signal from the micro-machined receiver of each of the micro-machined transceivers of the sensing chip used in Example 2 may be enhanced by the method of the second aspect of the disclosure.

With reference to FIG. 13, a reference amplitude of an electric signal for the aqueous solution of sodium dodecyl sulfate is about 1.72 V. In Comparative Example 1, the variation coefficient is 16.81% and a difference between the reference amplitude of the electric signal for the aqueous solution of sodium dodecyl sulfate and the amplitude of the electric signal measured for the fluid containing ractopamine is 0.5213 V. In Example 2, the variation coefficient is 1.18% and a difference between the reference amplitude of the electric signal for the aqueous solution of sodium dodecyl sulfate and the amplitude of the electric signal measured for the fluid containing ractopamine is 0.0589 V. Both of the values in Example 2 are significantly reduced as compared to those in Comparative Example 1, demonstrating that the sensitivity of the micro-machined transceivers of the sensing chip treated by the method of the second aspect of the disclosure may be increased.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for increasing sensitivity of a batch of sensing chips, each of which includes:
   an upper carrier plate having at least one inlet port,
   a lower carrier plate having at least one outlet port and being spaced apart from the upper carrier plate to define an accommodation zone disposed downstream of the at least one inlet port,
   a spacer film having at least one micro-channel and being disposed in the accommodation zone so as to permit the at least one micro-channel to be in fluid communication with the at least one inlet port and the at least one outlet port, and
   at least one micro-machined transceiver, each of which includes:
      a micro-machined transmitter which includes an electrode set formed on a lower surface of the upper carrier plate and having a positive patterned electrode and a negative patterned electrode, and a first patterned piezoelectric layer formed on one of the positive and negative patterned electrodes by drop-on-demand deposition, and
      a micro-machined receiver which includes an electrode set formed on an upper surface of the lower carrier plate and having a positive patterned electrode and a negative patterned electrode, and a second patterned piezoelectric layer formed on one of the positive and negative patterned electrodes of the micro-machined receiver by drop-on-demand deposition, the method comprising steps of:
   a) selecting at least three of the micro-machined transceivers;
   b) conducting for each of the at least three of the micro-machined transceivers the following sub-steps of:
      b1) introducing a blank liquid into the micro-channel via the inlet port,
      b2) applying an alternate voltage (V1) not larger than 40 V to the micro-machined transmitter for a period of time, the alternative voltage (V1) being in a waveform selected from the group consisting of a sine waveform, a square waveform, and a triangle waveform, and
      b3) measuring an amplitude (V2) of an electric signal from the micro-machined receiver to obtain a maximum value $V_{max}$ and a minimum value $V_{min}$, the maximum value $V_{max}$ and the minimum value $V_{min}$ being a maximum value and a minimum value of the amplitude (V2), respectively;

c) measuring a mid-value $V_{mid}$ according to Formula (A)

$$V_{mid}=(V_{max}+V_{min})/2 \quad \text{(A)};$$

d) determining the threshold voltage $V_{threshold}$ of a batch of the sensing chips to be the $V_{mid}$ when a precision ratio calculated according to Formula (B) is not larger than 50%

$$\text{precision ratio}=((V_{max}-V_{min})/V_{mid})\times 100\% \quad \text{(B)},$$

wherein sub-steps b2) and b3) are conducted periodically until the threshold voltage $V_{threshold}$ is determined; and e) conducting for each of the remaining micro-machined transceivers of the batch of the sensing chips the following sub-steps of:
  e1) introducing the blank liquid into the micro-channel via the inlet port;
  e2) applying the alternate voltage (V1) not larger than 40 V to the micro-machined transmitter for the period of time,
  e3) measuring the amplitude (V2) of the electric signal from the micro-machined receiver, and
  e4) ceasing sub-steps B1)-B3) if a deviation ratio calculated from Formula (C) is not larger than 25%

$$\text{deviation ratio}=(|V2-V_{threshold}|/V_{threshold})\times 100\% \quad \text{(C)}:$$

wherein the precision ratio is 0.6%; and
wherein the deviation ratio is 0.3%.

2. The method according to claim 1, wherein the alternate voltage (V1) has a frequency ranging from 1 kHz to 10 MHz.

3. The method according to claim 1, wherein the alternate voltage (V1) is in a range from 0.4 V to 40 V.

4. The method according to claim 1, wherein the period of time in sub-step b2) is in a range from 0.1 s to 30 s.

5. The method according to claim 1, wherein the blank liquid includes deionized water.

6. The method according to claim 1, wherein a ratio of a surface area of the first patterned piezoelectric layer to a total surface area of the positive and negative patterned electrodes of the micro-machined transmitter ranges from 0.40 to 0.85.

7. The method according to claim 1, wherein a ratio of a surface area of the second patterned piezoelectric layer to a total surface area of the positive and negative patterned electrodes of the micro-machined receiver ranges from 0.40 to 0.85.

8. The method according to claim 1, wherein the first and second patterned piezoelectric layers are formed from a piezoelectric polymer.

9. The method according to claim 8, wherein the piezoelectric polymer is selected from a group consisting of polyvinylidene difluoride (PVDE), polyvinylidene difluoride-co-trifluoroethylene (P(VDE-TrFE)), and a combination thereof.

10. The method according to claim 1, wherein the alternate voltage (V1) is 4.0 V.

11. The method according to claim 1, wherein the alternate voltage (V1) is 4.0 V.

* * * * *